(12) United States Patent
Choi et al.

(10) Patent No.: US 12,154,908 B2
(45) Date of Patent: Nov. 26, 2024

(54) DISPLAY DEVICE USING SEMICONDUCTOR LIGHT-EMITTING DIODES

(71) Applicant: LG ELECTRONICS INC., Seoul (KR)

(72) Inventors: Hwanjoon Choi, Seoul (KR); Yonghan Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 18/043,256

(22) PCT Filed: Aug. 31, 2020

(86) PCT No.: PCT/KR2020/011603
§ 371 (c)(1),
(2) Date: Feb. 27, 2023

(87) PCT Pub. No.: WO2022/045414
PCT Pub. Date: Mar. 3, 2022

(65) Prior Publication Data
US 2023/0326929 A1    Oct. 12, 2023

(51) Int. Cl.
*H01L 27/12*  (2006.01)
*H01L 25/075*  (2006.01)
*H01L 25/16*  (2023.01)

(52) U.S. Cl.
CPC ........ *H01L 27/124* (2013.01); *H01L 25/0753* (2013.01); *H01L 25/167* (2013.01)

(58) Field of Classification Search
CPC . H01L 27/124; H01L 25/167; H01L 25/0753; H01L 33/62; G09G 3/32; G09G 2330/10; G09G 2300/0426
See application file for complete search history.

(56) References Cited

U.S. PATENT DOCUMENTS

| 2016/0071478 A1* | 3/2016 | Takahashi ............. H01L 27/124 345/212 |
| 2019/0229097 A1 | 7/2019 | Takeya et al. |
| 2020/0266180 A1 | 8/2020 | Pendse |

FOREIGN PATENT DOCUMENTS

| KR | 1020180103093 | 9/2018 |
| KR | 1020190006430 | 1/2019 |
| KR | 1020200004688 | 1/2020 |

OTHER PUBLICATIONS

PCT International Application No. PCT/KR2020/011603, Written Opinion and International Search Report dated May 27, 2021, 15 pages.

* cited by examiner

*Primary Examiner* — Yaron Cohen
(74) *Attorney, Agent, or Firm* — LEE, HONG, DEGERMAN, KANG & WAIMEY

(57) ABSTRACT

The present invention relates to a display device, using semiconductor light-emitting diodes, comprising: a wiring board which comprises a row line for providing a row signal, a column line for providing a column signal, a VCC line connected to a VCC input terminal, and a VDD line connected to a VDD input terminal; and an interposer which is provided on the wiring board, has pixels, comprising semiconductor light-emitting diodes, along a plurality of rows and columns, and comprises IC chips for controlling the pixel light emission. The interposer comprises: a first terminal connected to the row line and for transmitting the row signal to the IC chips; a second terminal connected to the column line and for transmitting the column signal to the IC chips; a third terminal connected to the VCC line and connecting the VCC input terminal and the IC chips; and a fourth terminal connected to the VDD line and connecting the VDD input terminal and the IC chips.

20 Claims, 20 Drawing Sheets

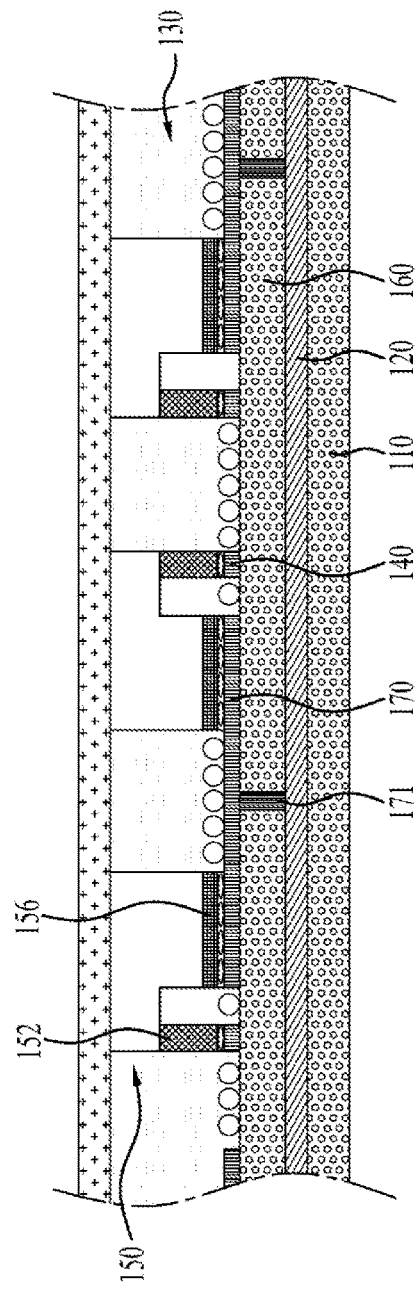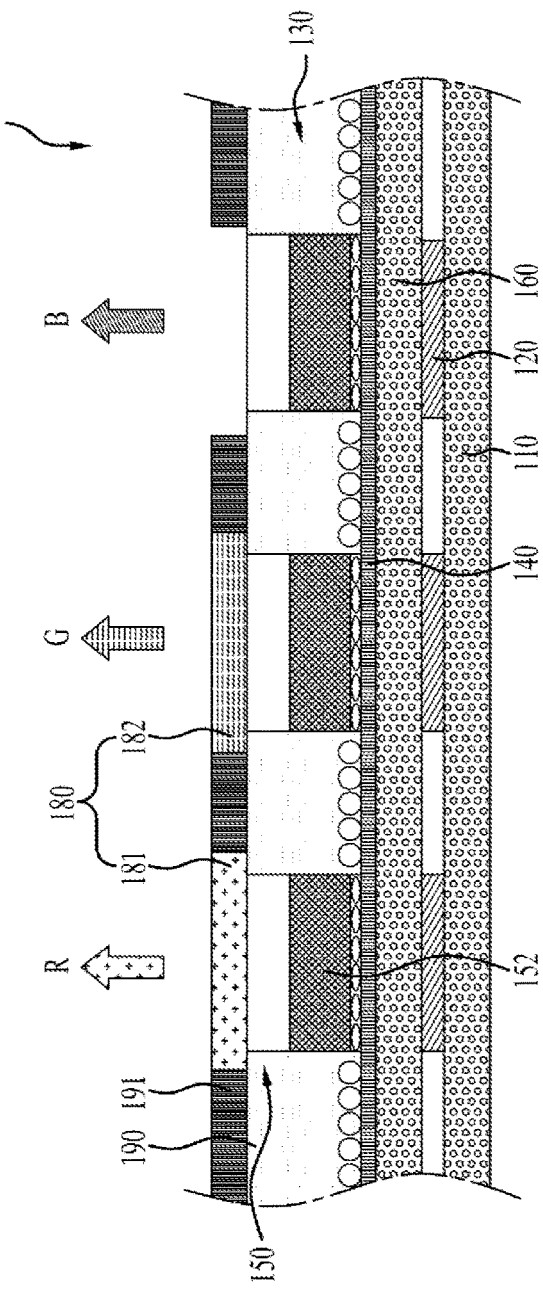

(a)          (b)

DISPLAY DEVICE USING SEMICONDUCTOR LIGHT-EMITTING DIODES

CROSS-REFERENCE TO RELATED APPLICATION(S)

This application is the National Stage filing under 35 U.S.C. 371 of International Application No. PCT/KR2020/011603, filed on Aug. 31, 2020, the contents of which is hereby incorporated by reference herein in its entirety.

TECHNICAL FIELD

The present disclosure relates to a display device using a semiconductor light emitting element. Specifically, the present disclosure relates to a display device in which interposers, each of which includes a plurality of pixels composed of semiconductor light emitting elements and controls the pixels via a single IC chip, are arranged.

BACKGROUND

A light emitting diode (LED) is a well-known semiconductor light emitting element that converts current into light. Starting with commercialization of a red LED using a GaAsP compound semiconductor in 1962, the LED has been used as a light source for displaying an image of an electronic device including an information communication device along with a GaP:N-based green LED. The semiconductor light emitting element has various advantages over a filament-based light emitting element, such as a long life, low power consumption, excellent initial driving characteristics, and high vibration resistance.

The semiconductor light emitting element has recently been miniaturized and are widely applied to a flexible display and a stretchable display. The semiconductor light emitting elements may be classified into a mini LED and a micro LED in size. For convenience, the mini LED may have a size of hundreds of micrometers and the micro LED may have a size of several to several tens of micrometers.

As the semiconductor light emitting element is miniaturized, there is a problem that a transfer process is difficult. A typical transfer method is a pick & place process. A process of transferring the miniaturized semiconductor light emitting elements one by one to manufacture a large-sized display with high resolution has a problem that requires a lot of time. In addition, the micro LED is too small to pick, so that the micro LED is unsuitable for using pick & place fixing.

In addition, when the semiconductor light emitting elements are defective, it is difficult to replace them one by one, resulting in a decrease in a display device manufacturing yield or repair efficiency.

SUMMARY

Technical Problem

A purpose of one embodiment of the present disclosure is to reduce the time required for pick & place by providing a unit structure including a plurality of pixels without performing the pick & place process on each semiconductor light emitting element.

In addition, a purpose of one embodiment of the present disclosure is to reduce coupling defects by performing pick & place on a unit structure larger than individual semiconductor light emitting elements.

In addition, a purpose of one embodiment of the present disclosure is to increase manufacturing yield and repair efficiency by providing a replaceable unit structure.

In addition, a purpose of one embodiment of the present disclosure is to increase flexibility of a display device to which a unit structure is coupled.

In addition, a purpose of one embodiment of the present disclosure is to reduce a thickness of a display device to which a unit structure is coupled.

Furthermore, another purpose of one embodiment of the present disclosure is to solve various problems not mentioned herein. A person skilled in the art may understand the entire meaning of the present document and drawings.

Technical Solutions

A display device using a semiconductor light emitting element for achieving the above purposes includes a wiring substrate including a row line for providing a row signal, a column line for providing a column signal, a VCC line connected to a VCC input terminal, and a VDD line connected to a VDD input terminal, and an interposer disposed on the wiring substrate, having pixels including the semiconductor light emitting elements disposed along a plurality of rows and a plurality of columns, and an IC chip for controlling light emission of the pixels, and the interposer includes a first terminal connected to the row line and transmitting the row signal to the IC chip, a second terminal connected to the column line and transmitting the column signal to the IC chip, a third terminal connected to the VCC line so as to connect the VCC input terminal and the IC chip, and a fourth terminal connected to the VDD line so as to connect the VDD input terminal and the IC chip.

In one implementation, the row signal may be a 2-state signal of high and low for turning on/off a transistor disposed on the IC chip, and the column signal may be a 2-state signal of high and low for emitting light from the semiconductor light emitting element in a state in which the transistor is turned on.

In one implementation, the IC chip may sense at least one of a data reception signal and a data reception end signal using the high and low states of the row signal and the column signal, and provide the row signal and the column signal applied between the data reception signal and the data reception end signal to a driving circuit for driving the pixel.

In one implementation, the IC chip may count pulses included in the row signal after sensing the data reception signal, and sequentially provide the row signal and the column signal to a driving circuit of a corresponding pixel corresponding to the count.

In one implementation, in response to the pulse included in the row signal, the IC chip may sense the data reception signal or the data reception end signal based on the column signal being switched from the high state to the low state or vice versa.

In one implementation, in response to the pulse included in the row signal, the IC chip may sense one of the data reception signal and the data reception end signal based on the column signal being switched from the high state to the low state and sense the other based on the column signal being switched from the low state to the high state.

In one implementation, the interposer may include a plurality of interposers arranged along the plurality of rows and the plurality of columns, the row signals may be provided to the interposers along the plurality of row lines, and the row signals may partially overlap such that an n-th data reception end signal is applied to an interposer disposed in an n-th row, and simultaneously, an n+1-th data reception signal is applied to an interposer disposed in an n+1-th row.

In one implementation, when an n-th data reception signal and the n-th data reception end signal applied to the interposer disposed in the n-th row are different from each other, the interposer disposed in the n+1 row may sense an identical signal as the n-th data reception end signal as the n+1-th data reception signal and sense an identical signal as the n-th data reception signal as an n+1-th data reception end signal.

In one implementation, a distance between an edge and a pixel adjacent to the edge may be smaller than a half of a pitch distance between the pixels in the interposer.

In one implementation, the display device using the semiconductor light emitting element may further include a protective film for covering an area between the interposers on the wiring substrate.

In one implementation, the interposer may include a first layer including the IC chip on a top surface thereof and including first to fourth terminals connected to the IC chip on a rear surface thereof, a second layer deposited on the first layer avoiding an area where the IC chip is disposed and including the semiconductor light emitting element on a top surface thereof, and a third layer deposited on the second layer and covering the IC chip and the semiconductor light emitting element.

In one implementation, at least one of the second layer or the third layer may include a wiring circuit for connecting the IC chip and the semiconductor light emitting element to each other.

In one implementation, the interposer may include black molding for covering the first to fourth terminals.

In one implementation, the IC chip may drive the semiconductor light emitting element in an active matrix (AM) manner.

Advantageous Effects

The display device according to one embodiment may reduce the time required for the pick & place by providing the unit structure including the plurality of pixels without performing the pick & place process on each semiconductor light emitting element.

In addition, the display device according to one embodiment may reduce the coupling defects by performing the pick & place on the unit structure larger than the individual semiconductor light emitting elements.

In addition, the display device according to one embodiment may increase the manufacturing yield and the repair efficiency by providing the replaceable unit structure.

In addition, the display device according to one embodiment may increase the flexibility of the display device while the unit structure is coupled to the display device.

In addition, the display device according to one embodiment may reduce the thickness of the display device while the unit structure is coupled to the display device.

Furthermore, according to another embodiment of the present disclosure, there are additional technical effects not mentioned herein. A person skilled in the art may understand the entire meaning of the present document and drawings.

BRIEF DESCRIPTION OF THE DRAWINGS

FIGS. 3A and 3B are cross-sectional diagrams taken along the cutting lines B-B and C-C in FIG. 2;

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
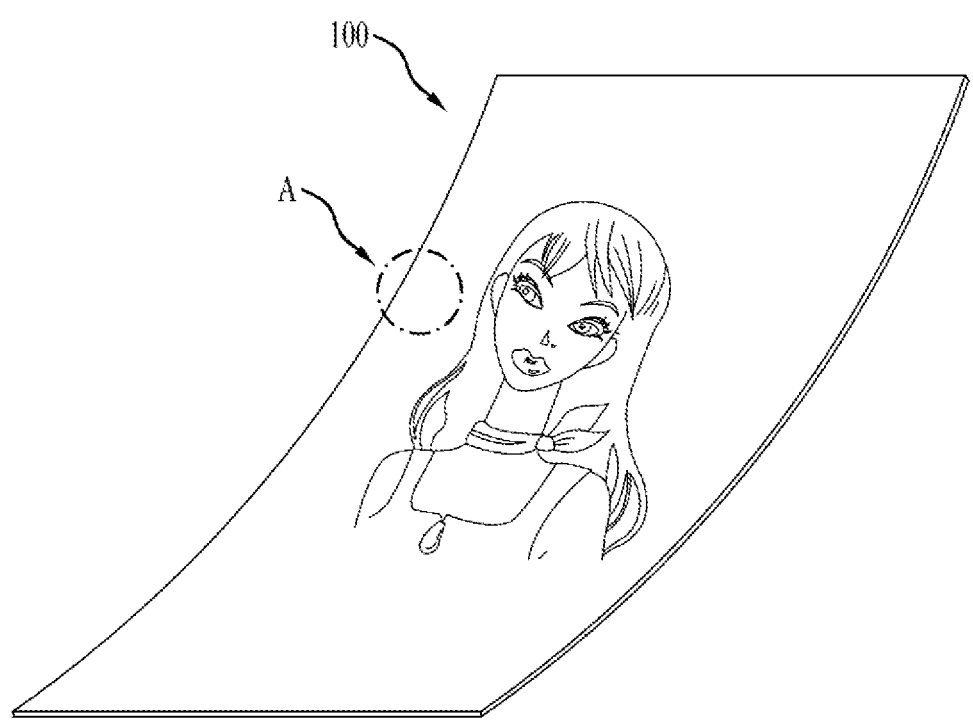
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
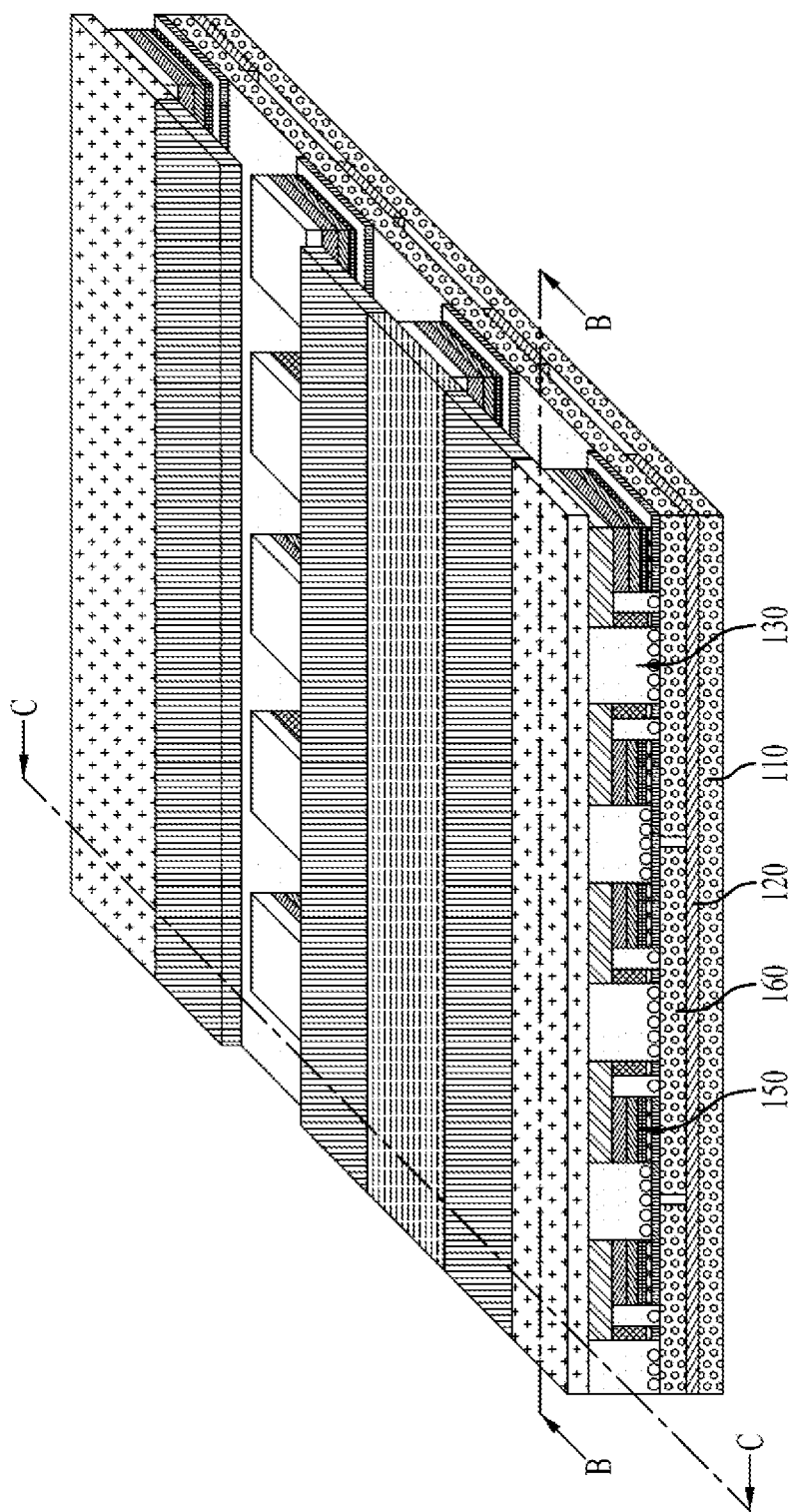
FIG. 2 is a partially enlarged diagram showing a part A shown in FIG. 1.

FIG. 2 is a partially enlarged view showing part A of FIG. 1.

FIGS. 3A and 3B are cross-sectional views taken along lines B-B and C-C in FIG. 2.

Figure 4:
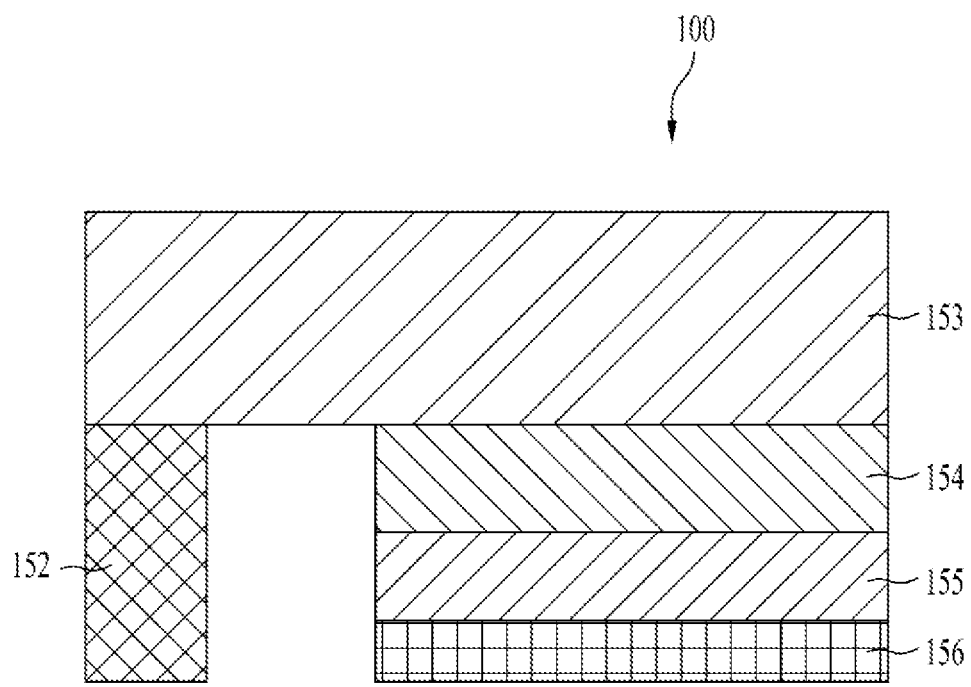
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
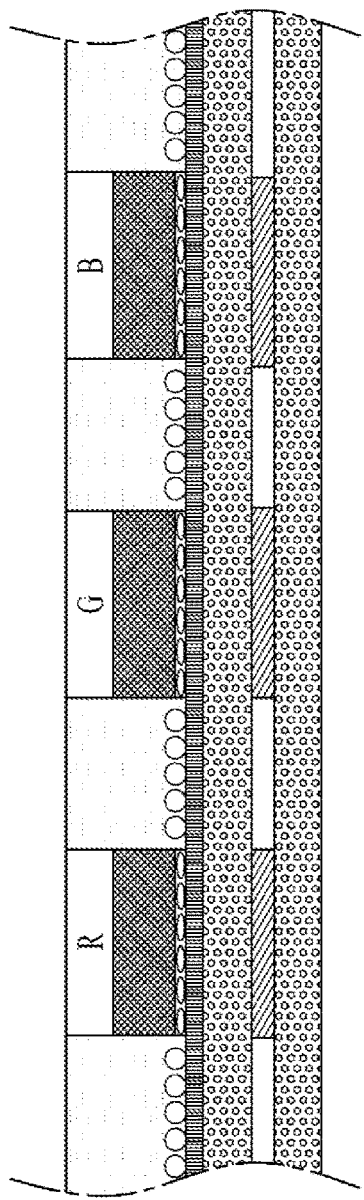
FIGS. 5A to 5C are conceptual diagrams illustrating various examples of color implementation with respect to a flip-chip type semiconductor light emitting element.
Figure 5B:
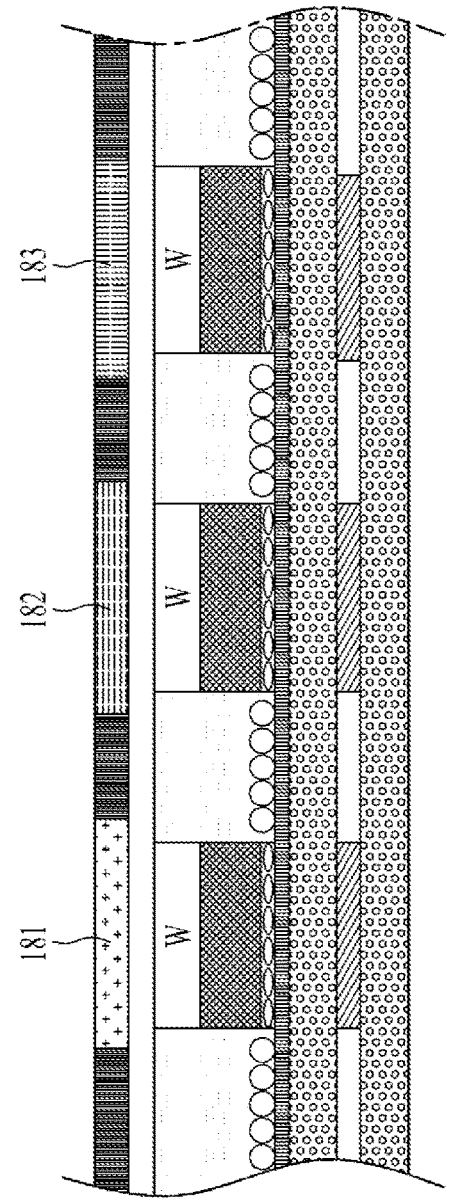
Figure 5C:
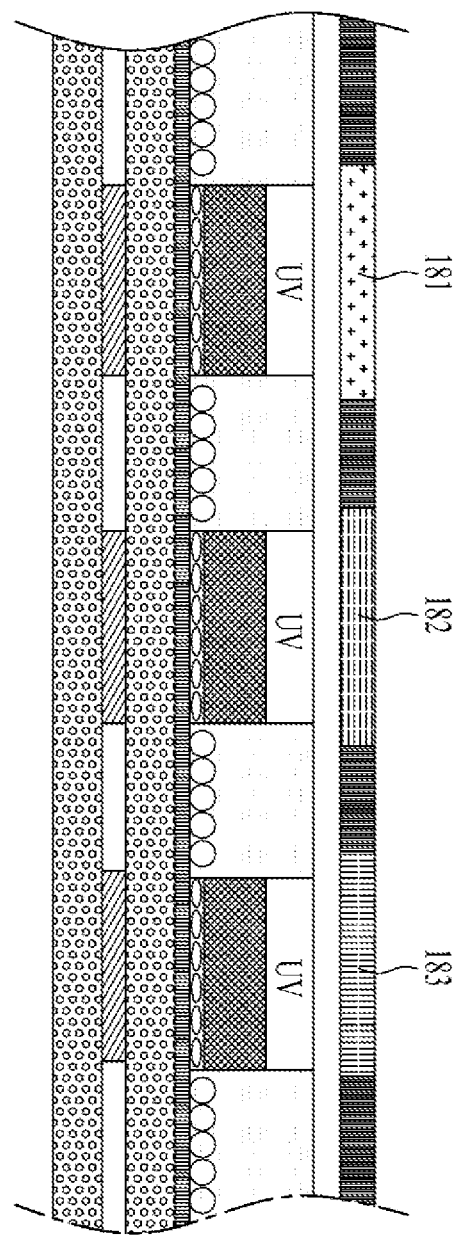

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction.

Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
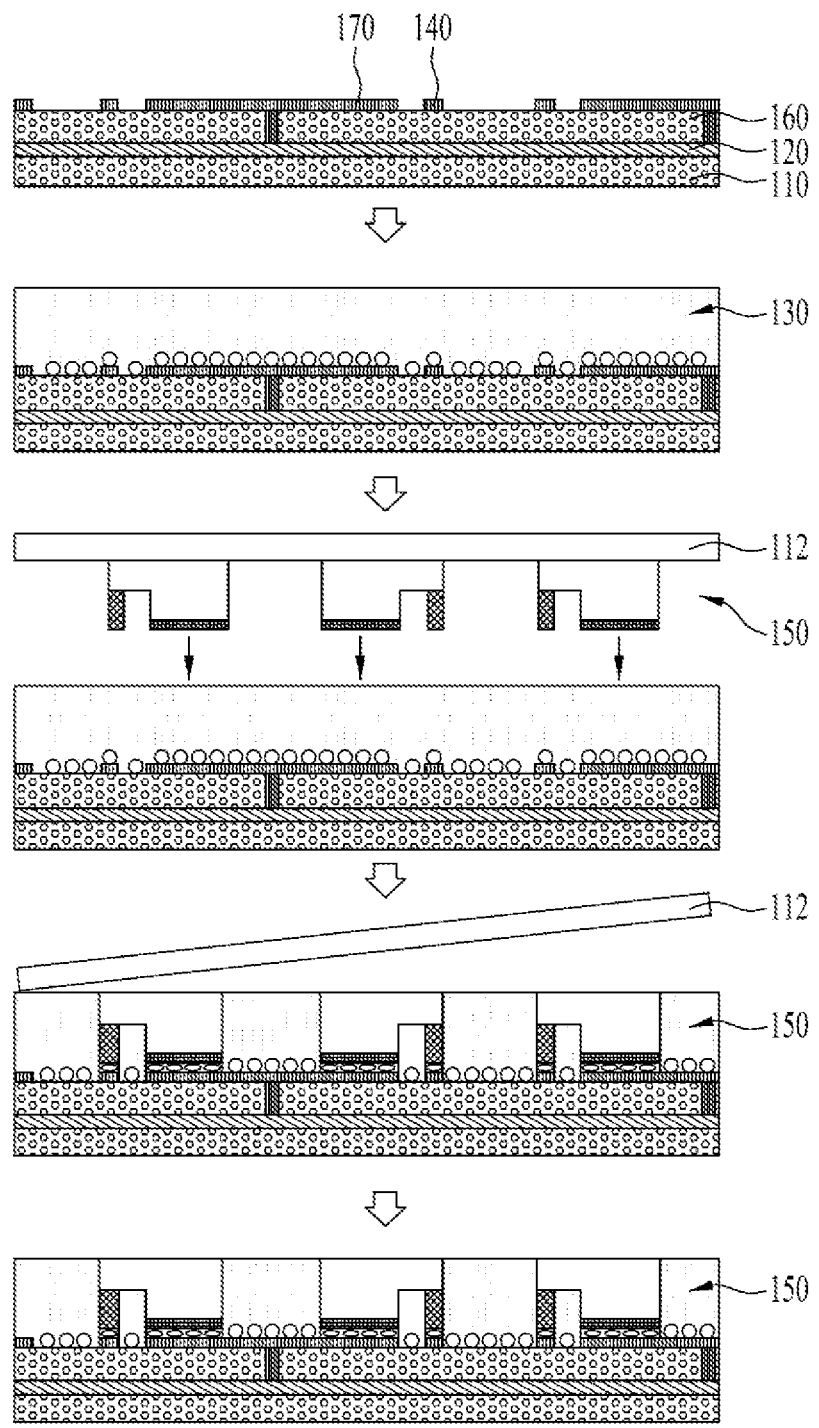
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
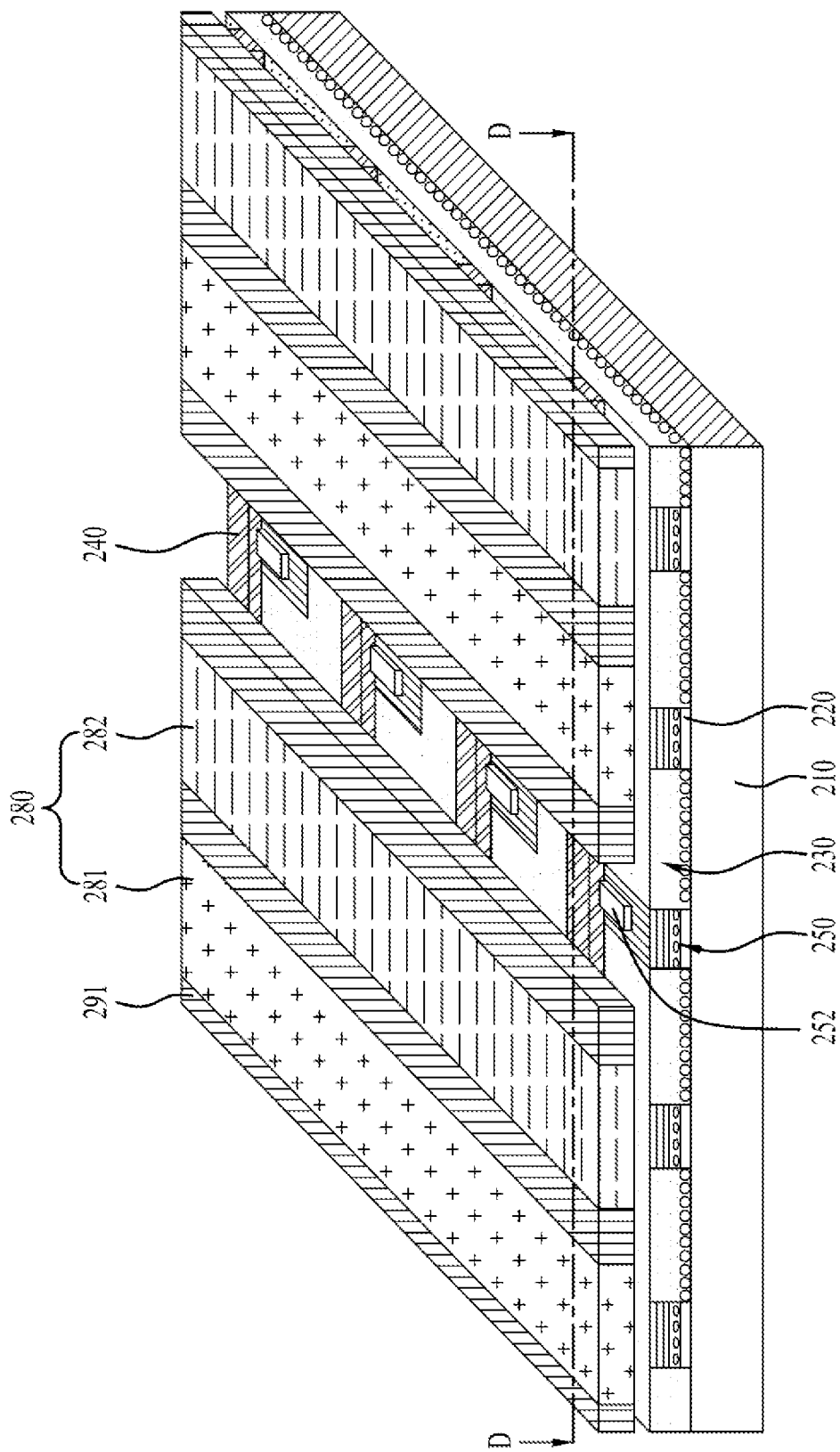
FIG. 7 is a perspective diagram of a display device using a semiconductor light emitting element according to another embodiment of the present disclosure.
Figure 8:
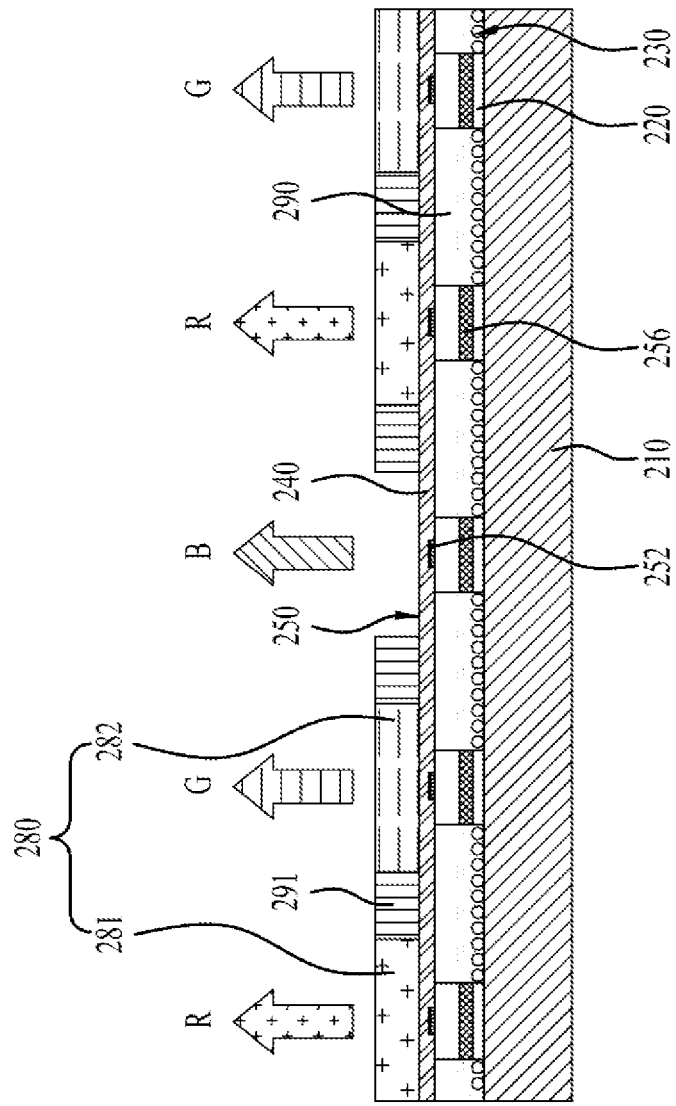
FIG. 8 is a cross-sectional diagram taken along a cutting line D-D shown in FIG. 8.
Figure 9:
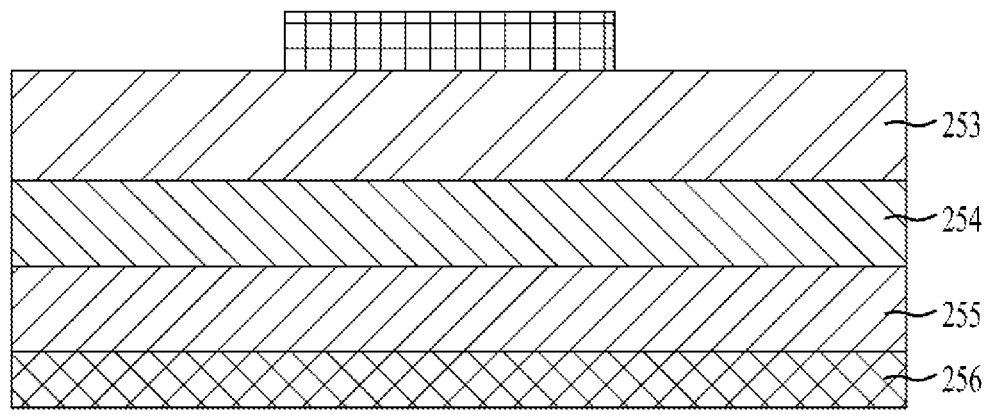
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
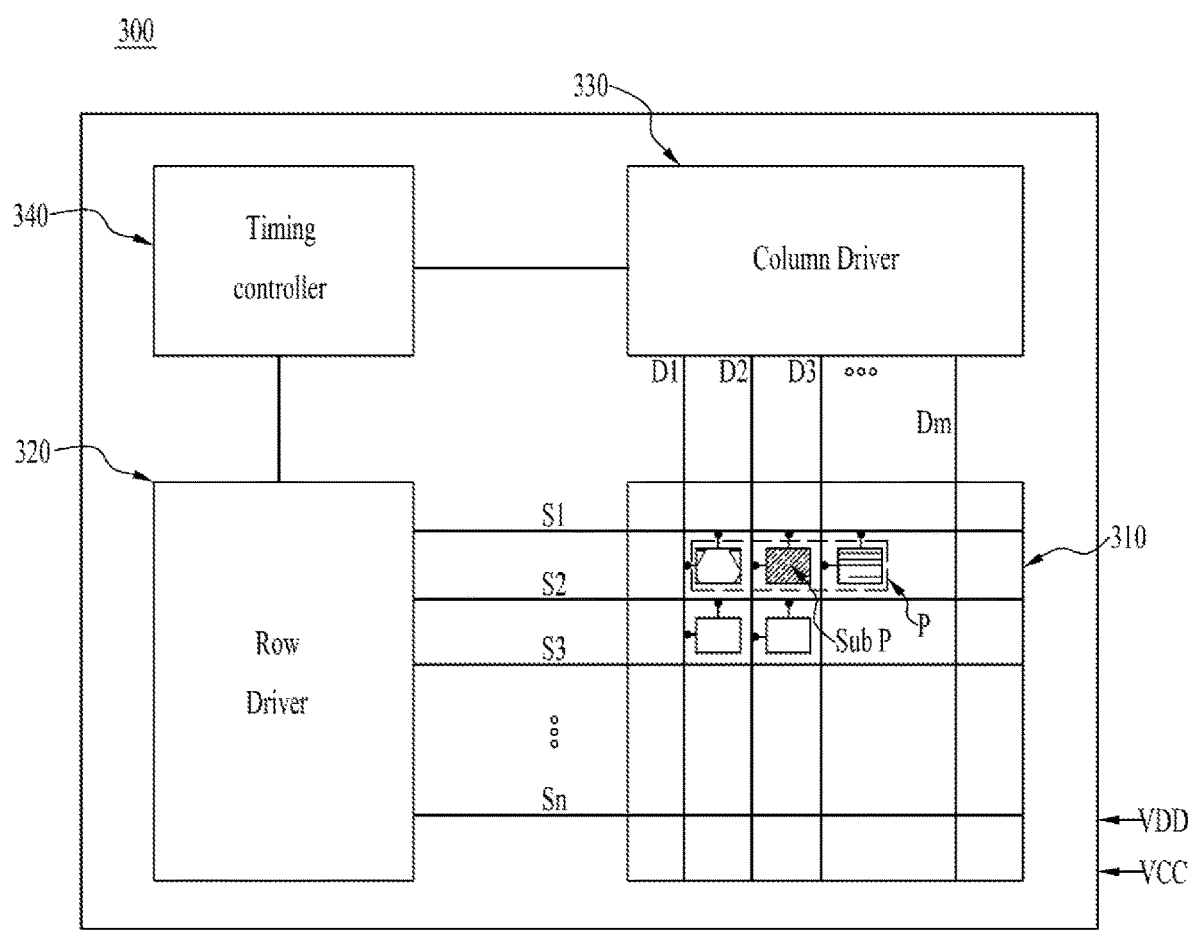
FIG. 10 is a structural diagram of a display device according to one embodiment.
Figure 11:
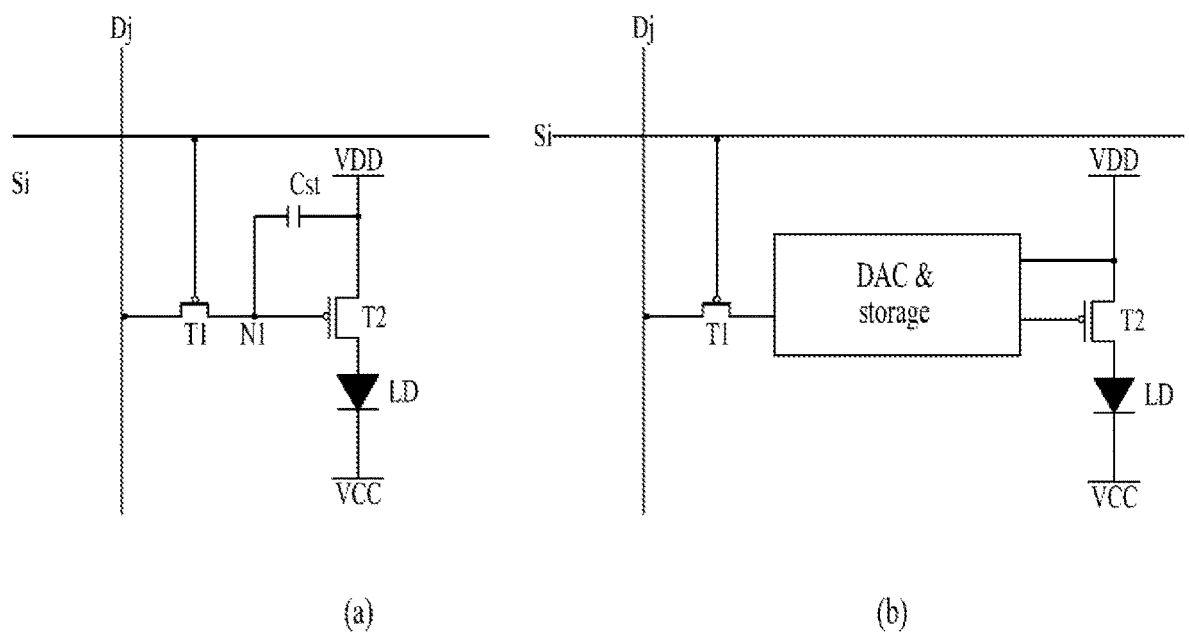
FIG. 11 is a diagram of a circuit included in a sub-pixel in FIG. 10.

FIG. 10 is a structural diagram of a display device according to one embodiment. FIG. 11 is a diagram of a circuit included in a sub-pixel in FIG. 10.

A display device 300 according to one embodiment may include an image output panel 310 and output an image on the image output panel 310. The display device 300 may include a row driver 320 that provides a row signal to the image output panel 310, a column driver 330 that provides a column signal, and a timing controller 340 that controls the row driver 320 and the column driver 330. In this regard, the row signals may correspond to scan signals provided along row lines S1 to Sn, and column signals may correspond to data signals provided along column lines D1 to Dm.

The image output panel 310 may include the multiple row lines S1 to Sn, the multiple column lines D1 to Dm, and multiple pixels P. Additionally, the image output panel 310 may include a VCC line (not shown) connected to a VCC input terminal and a VDD line (not shown) connected to a VDD input terminal. The VCC input terminal and the VDD input terminal may be fixed power input terminals providing different fixed powers. The multiple row lines S1 to Sn are sequentially arranged in a row direction to transmit the row signals, respectively, and the multiple column lines D1 to Dm are sequentially arranged in a column direction to transmit the column signals, respectively. The multiple row lines S1 to Sn and multiple column lines D1 to Dm may be arranged in a matrix form, and may form one sub-pixel Sub P at each intersection thereof. The sub-pixel Sub P may be one of a red pixel, a green pixel, and a blue pixel, and the red pixel, the green pixel, and the blue pixel may constitute one pixel P.

The row driver 320 may provide the row signals by being connected to the row lines S1 to Sn. In this regard, the row signal may be a 2-state signal of high and low. The row signal may include a pulse signal for turning a first transistor T1 on and off. For example, the first transistor T1 may be turned on when the row signal is high and turned off when the row signal is low, or vice versa.

The column driver 330 may provide the column signals by being connected to the column lines D1 to Dm to. In this regard, the column signal may be a 2-state signal of high and low. The column signal may be a signal that is applied when the first transistor T1 is turned on and emits light from a light emitting element LD.

The basic concept of emitting the light from the light emitting element LD is shown in (a) in FIG. 11. The basic concept shown in (a) in FIG. 11 is a circuit configuration corresponding to an active matrix (AM). When the first transistor T1 is turned on by the row signal, the column signal may be applied to a gate of a second transistor T2 to allow current to flow from the VDD power input terminal to the VCC power input terminal and emit the light from the light emitting element LD. When the first transistor T1 is turned off by the row signal, with a charge stored in a capacitor Cst disposed between a first node N1 and the VDD power input terminal, a signal may be applied to the gate of the second transistor T2 during one frame to maintain the light emitting element LD in the light emitting state.

Brightness of the light emitting element LD may be controlled by a voltage level or a pulse arrangement (digital data) of the applied column signal. (a) in FIG. 11 shows a basic circuit configuration for controlling the brightness of the light emitting element LD by the voltage level of the column signal, and (b) in FIG. 11 shows a basic circuit configuration controlled by the digital data of the applied column signal. Referring to (b) in FIG. 11 additionally, a driving circuit of the light emitting element LD may include a digital to analog converter (DAC) that converts the digital data of the applied column signal into an analog signal and storage that stores the digital data or the voltage level during one frame instead of the first node N1 and the capacitor Cst. For example, 8-bit digital data applied to the driving circuit of the light emitting element LD may emit the light from the light emitting element LD in 256 gray levels.

The timing controller 340 may receive input image data Data and an input control signal for controlling display of the same from an external graphic controller (not shown). The input control signals may include, for example, a horizontal synchronization signal Hsync, a vertical synchronization signal Vsync, and a main clock MCLK. The timing controller 340 may transfer the input image data Data to the column driver 330, and generate a scan control signal CONT1 and a data control signal CONT2 and transmit the scan control signal CONT1 and the data control signal CONT2 to the row driver 320 and the column driver 330, respectively. The scan control signal CONT1 may include a scan start signal SSP instructing to start a scan and at least one clock signal SCLK, and the data control signal CONT2 may include a horizontal synchronization start signal STH instructing transmission of input image data for pixels P in one row and at least one clock signal DCLK.

Figure 12:
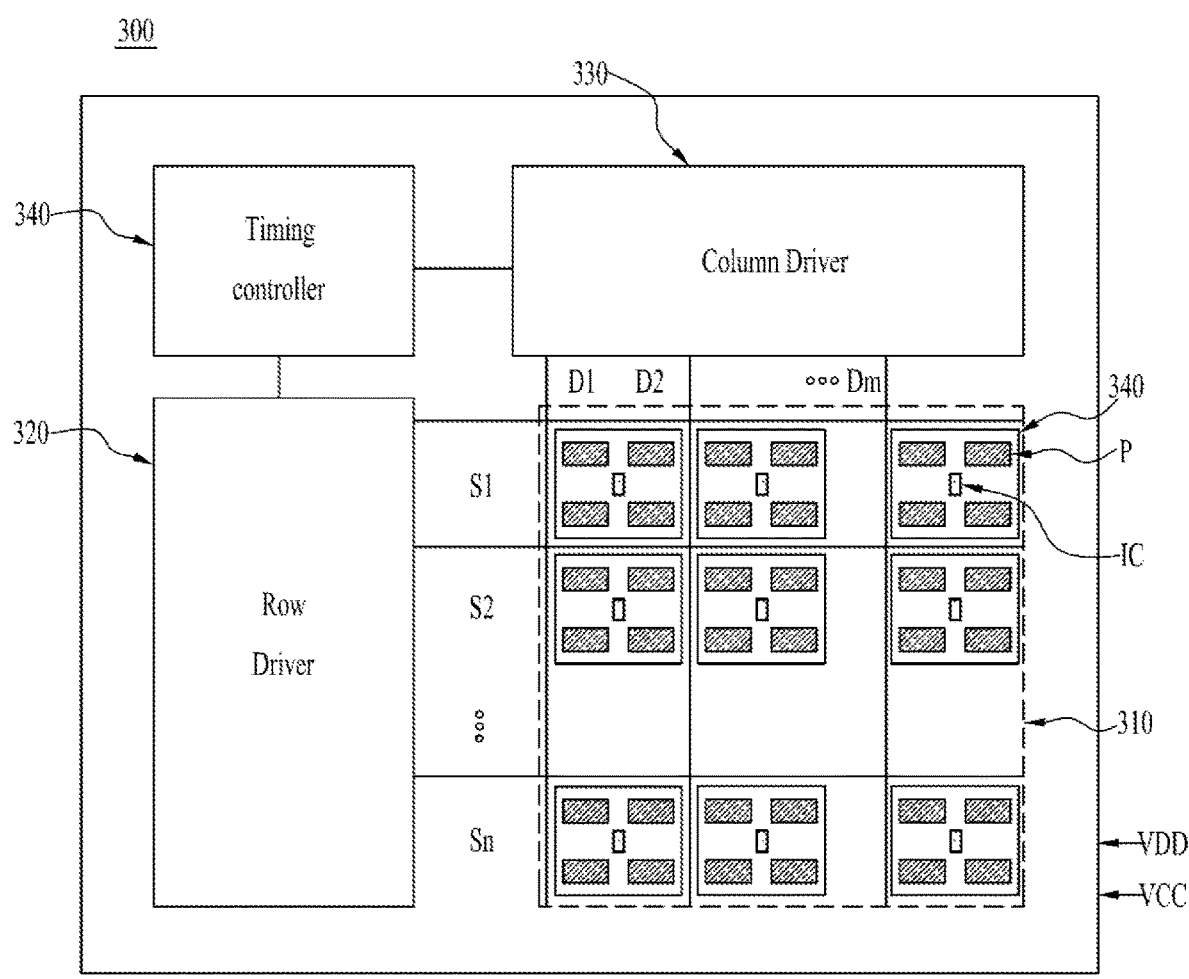
FIG. 12 is a structural diagram of a display device including an interposer according to one embodiment.

FIG. 12 is a structural diagram of a display device including an interposer according to one embodiment. A description of the same component may refer to the description of FIG. 11.

The display device 300 according to one embodiment may include the image output panel 310 and output an image on the image output panel 310. The display device 300 may include the row driver 320 for providing the row signals to the image output panel 310, the column driver 330 for providing the column signals, and the timing controller 340 for controlling the row driver 320 and the column driver 330. In this regard, the row signals may correspond to the scan signals provided along the row lines S1 to Sn, and the column signals may correspond to the data signals provided along the column lines D1 to Dm.

The image output panel 310 may include the multiple row lines S1 to Sn, the multiple column lines D1 to Dm, and the multiple pixels P. Additionally, the image output panel 310 may include the VCC line (not shown) connected to the VCC input terminal and the VDD line (not shown) connected to the VDD input terminal. The VCC input terminal and the VDD input terminal may be the fixed power input terminals providing the different fixed powers. The multiple row lines S1 to Sn are sequentially arranged in the row direction to transmit the row signals, respectively, and the multiple column lines D1 to Dm are sequentially arranged in the column direction to transmit the column signals, respectively. The multiple row lines S1 to Sn and multiple column lines D1 to Dm may be arranged in the matrix form, and may include an interposer 340 at each intersection thereof.

The interposer 340 may include the multiple pixels P along a plurality of rows and columns and may include an IC chip for controlling light emission of the disposed pixels P. Specifically, the image output panel 310 may include the row lines S1 to Sn for providing the row signals, the column lines D1 to Dm for providing the column signals, and a wiring substrate including the VCC line (not shown) connected to the VCC input terminal and the VDD line (not shown) connected to the VDD input terminal, and the interposer 340 may be disposed on the wiring substrate in, for example, a pick & place process method.

The interposer 340 may include the plurality of pixels P, each of which is composed of the plurality of semiconductor light emitting elements, may be manufactured with an IC chip providing a control signal thereto, and may be assembled onto the wiring substrate. Because the interposer 340 is manufactured to correspond to the plurality of pixels P, it may offer advantages in terms of a manufacturing time, a repair, and the like compared to placing each semiconductor light emitting element individually using the pick & place process method. In addition, because the interposer 340 is able to provide the row signal and the column signal to the plurality of pixels by being connected to one row line and one column line, the numbers of row lines and column lines may be reduced compared to a standard resolution.

Hereinafter, a detailed structural diagram and a signal providing embodiment of the interposer 340 will be described.

Figure 13:
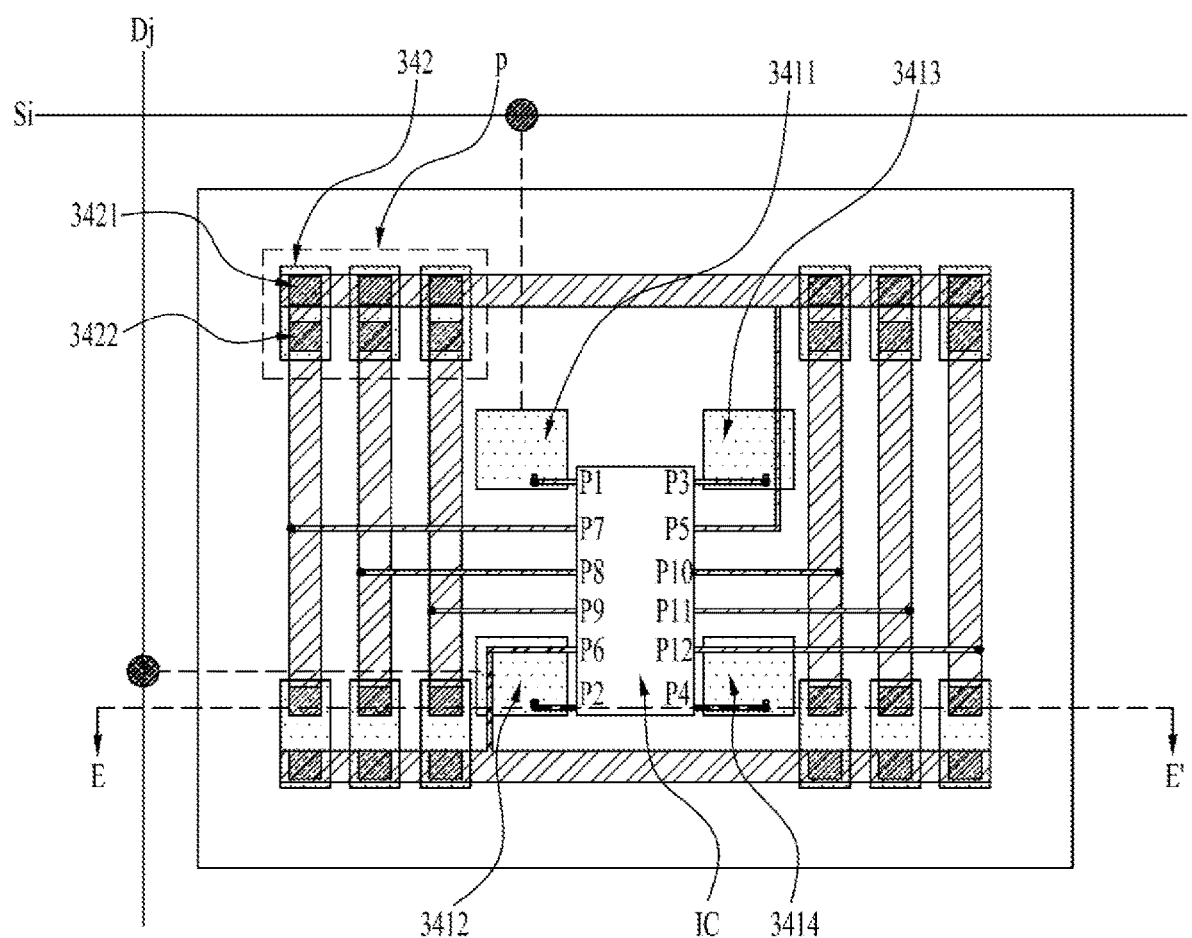
FIG. 13 is a structural diagram of an interposer according to one embodiment.

FIG. 13 is a structural diagram of an interposer according to one embodiment. A description of the same component may refer to the description of FIG. 12.

The interposer 340 may be disposed on the wiring substrate, include the pixels P composed of semiconductor light emitting elements 342 along the plurality of rows and columns, and include the IC chip that controls the light emission of the pixels P. In this regard, the pixels P may include a semiconductor light emitting element emitting red light, a semiconductor light emitting element emitting blue light, and a semiconductor light emitting element emitting green light.

The semiconductor light emitting element 342 may correspond to a mini LED or a micro LED. For example, the semiconductor light emitting element 342 may be a component that corresponds to the semiconductor light emitting elements 150 and 250 shown in FIGS. 4 and 9 or additionally includes a phosphor and a color filter. The semiconductor light emitting element 342 may include a first electrode 3421 and a second electrode 3422, brightness of the semiconductor light emitting element 342 may be controlled via a level difference in voltage or current applied to the first electrode 3421 and the second electrode 3422, and each electrode may be controlled by being connected to the IC chip.

The interposer 340 may include a first terminal 3411 connected to a row line Si and transmitting the row signal to the IC chip, a second terminal 3412 connected to a column line Dj and transmitting the column signal to the IC chip, a third terminal 3413 connected to the VCC line (not shown) to connect the VCC input terminal and the IC chip to each other, and a fourth terminal 3414 connected to the VDD line (not shown) to connect the VDD input terminal and the IC chip to each other.

The IC chip may include a plurality of pins respectively connected to the first to fourth terminals 3411 to 3414 and a plurality of pins connected to the electrodes 3421 and 3422 of the respective semiconductor light emitting elements 342.

Specifically, the IC chip may include a first pin P1 connected to the first terminal 3411 and receiving the row signal, a second pin P2 connected to the second terminal 3412 and receiving the column signal, a third pin P3 connected to the third terminal 3413 and receiving a VCC power, and a fourth pin P4 connected to the fourth terminal 3414 and receiving a VDD power.

Additionally, the number of pins connected to the electrodes 3421 and 3422 of the respective semiconductor light emitting elements 342 in the IC chip may be determined corresponding to a pixel arrangement. When the pixel P includes three semiconductor light emitting elements 342 and the pixels P of a n×m array are included, the number of pins connected to the semiconductor light emitting elements 342 in the IC chip may correspond to n+3*m. For example, referring to FIG. 13, the pins connected to the semiconductor light emitting elements 342 in the IC chip may include each of pins P5 and P6 for connecting each of the VDD power and the VCC power to the first electrodes 3421 of the semiconductor light emitting elements 342 arranged in the same row, and each of the pins P7 to P12 for providing the data signal to the second electrodes 3422 of the light emitting elements 342 arranged in the same column.

The IC chip may include the driving circuit for driving each pixel P (specifically, each semiconductor light emitting element 342) in the AM manner. The driving circuit for driving each semiconductor light emitting element 342 in the AM manner may be implemented in various embodiments other than the embodiment in FIG. 11.

However, while the IC chip includes the plurality of pixels P, the row signal and the column signal are respectively received from one row line Si and one column line Dj, so that the received row signal and column signal need to be provided to the driving circuit for each pixel P in a classified manner. Hereinafter, a block diagram of the IC chip for providing the signals to each pixel P in the classified manner will be described.

Figure 14:
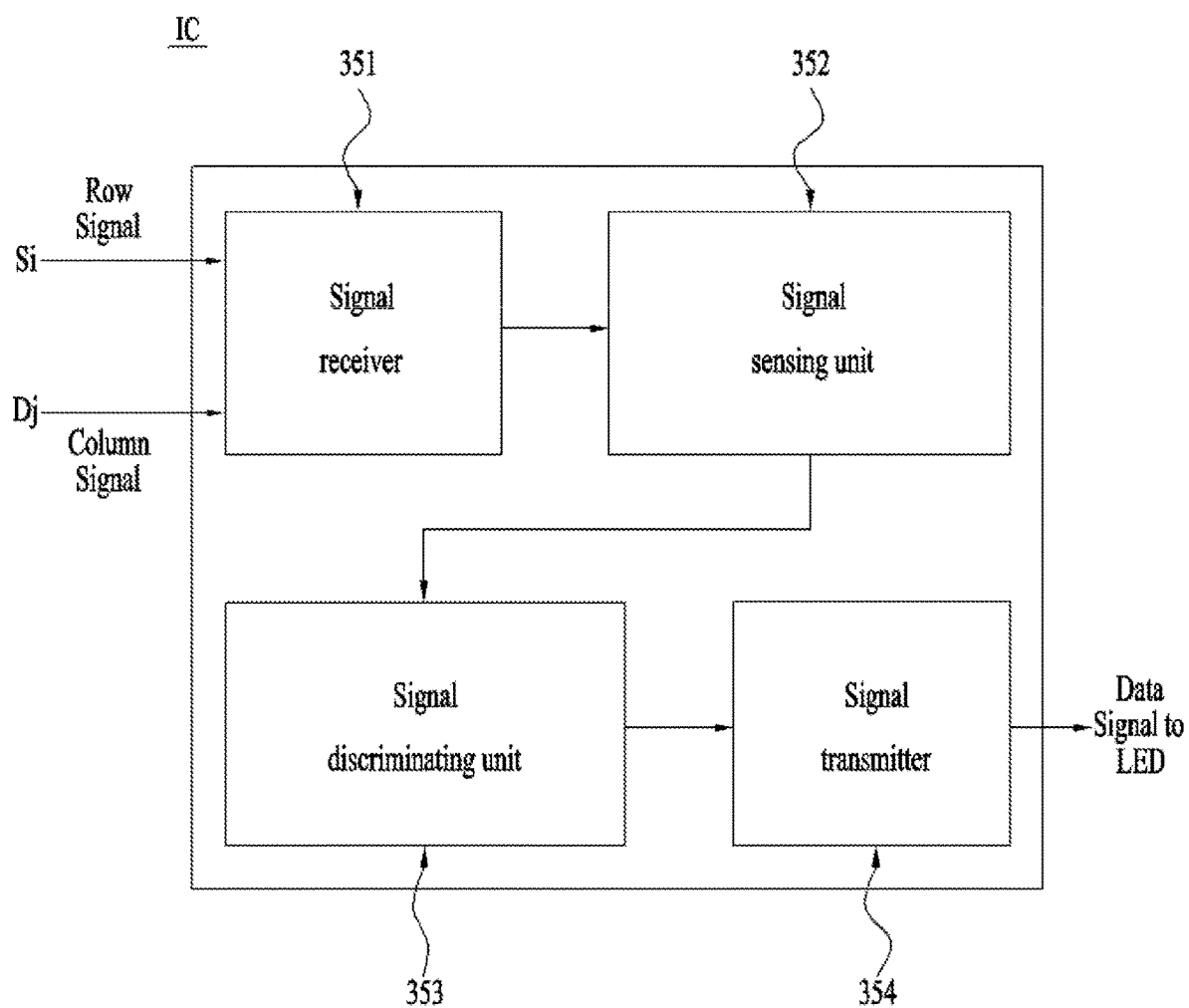
FIG. 14 is a block diagram of an IC chip included in an interposer.

FIG. 14 is a block diagram of an IC chip included in an interposer. A description of the same component may refer to the description of FIG. 13.

The IC chip included in the interposer 340 may include a signal receiver 351 connected to one row line Si and one column line Dj to receive the row signal and the column signal, a signal sensing unit 352 for sensing a data reception signal and a data reception end signal via the received row signal and column signal, a signal discriminating unit 353 for discriminating the row signal and the column signal applied between the data reception signal and the data reception end signal from each other corresponding to each pixel, and a signal transmitter 354 for providing the discriminated signals to the driving circuit of each pixel.

The signal receiver 351 and the signal transmitter 354 may be components included in the driving circuit for driving each semiconductor light emitting element 342 in the AM manner, and the signal sensing unit 352 and the signal discriminating unit 353 may be components that are connected to the driving circuit to sense whether the row signal and the column signal are signals to be transmitted to the pixels P and discriminate the row signal and the column signal from each other based on the corresponding pixel P.

The row signal provided from the row line Si may be the 2-state signal of high and low that turns on/off a transistor included (specifically, the first transistor T1 in FIG. 11) in the IC chip, and the column signal provided from the column line Dj may be the data signal that emits the light from the semiconductor light emitting element 342 and may be the 2-state signal of high and low. The row signal and the column signal may include the data reception signal and the data reception end signal to discriminate a signal additionally provided for each interposer. The data reception signal and the data reception end signal may be similar to a start condition and a stop condition used in an inter integrated circuit (I2C), which will be described in detail with reference to FIGS. 15 and 16.

When the data reception signal is sensed from the row signal and the column signal, the signal sensing unit 352 may sense the data reception end signal, and the signal discriminating unit 353 may discriminate the row signal and the column signal received after the data reception signal and before the data reception end signal for each pixel P and apply the discriminated row signal and column signal to the driving circuit of the corresponding pixel P via the signal transmitter 354.

In one embodiment, the signal discriminating unit 352 may count pulses included in the row signal applied after sensing the data reception signal, and discriminate the row signal and the column signal from each other in correspondence with the count, to correspond to the pixel. The row signal and the column signal may be sequentially applied corresponding to each pixel P disposed in the interposer. The signal discriminating unit 352 may count the pulses included in the row signal applied after sensing the data reception signal to discriminate the corresponding pixel P. Similarly, the signals discriminated for each pixel P may be discriminated for each sub-pixel sub P using the count of the row signal.

For example, when the interposer 340 contains a 2×2 pixel P array, one pixel P contains three sub-pixels sub P, and 8-bit digital data is applied to each sub-pixel sub P, a signal applied between counts 1 and 24 may be discriminated to a (1,1) pixel P, a signal applied between counts 25 and 48 may be discriminated to a (1,2) pixel P, a signal applied between counts 49 to 72 may be discriminated to a (2, 1) pixel P, and a signal applied between counts 73 to 96 may be discriminated to a (2, 2) pixel P.

Hereinafter, an embodiment of the row signal and the column signal applied to the interposer will be described.

Figure 15:
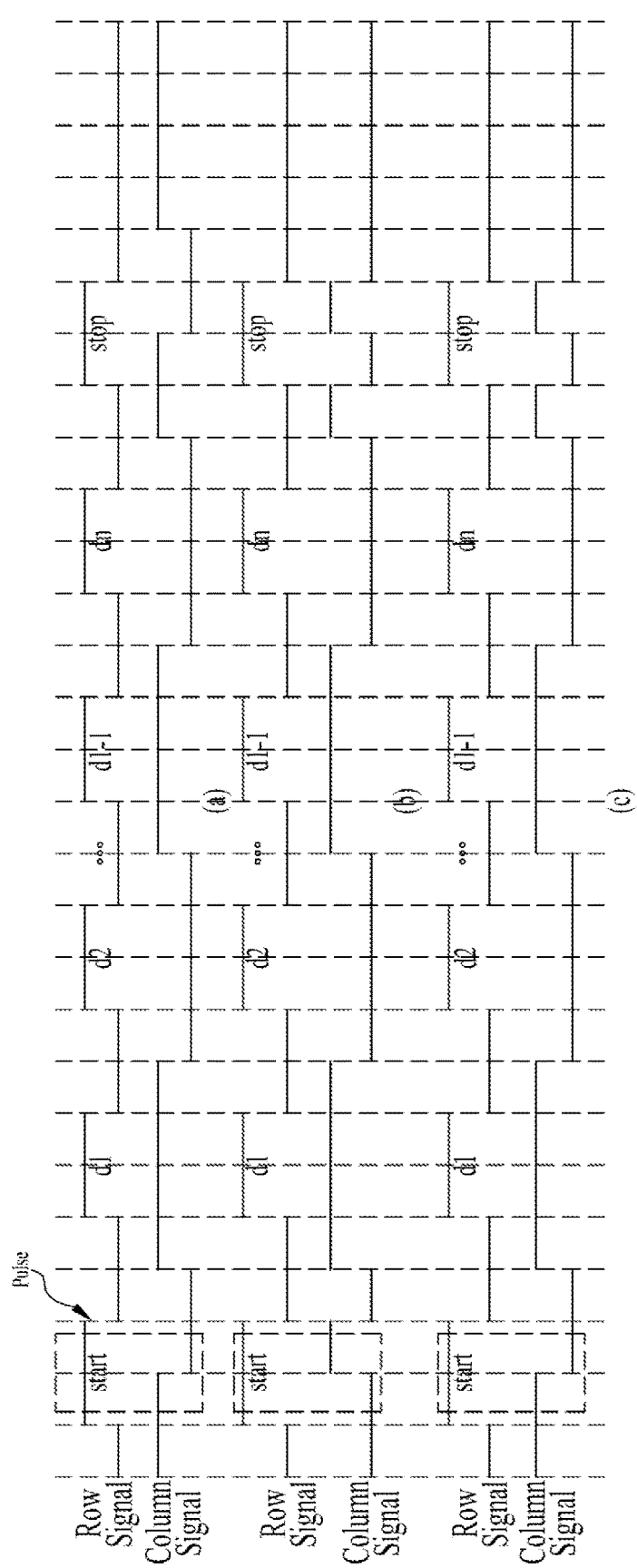
FIG. 15 shows an embodiment of a row signal and a column signal applied to an interposer.

FIG. 15 shows an embodiment of a row signal and a column signal applied to an interposer. Specifically, (a) and (b) in FIG. 15 show embodiments in which the data reception signal and the data reception end signal are identical to each other, and (c) in FIG. 15 shows an embodiment in which the data reception signal and the data reception end signal are different from each other.

The row signal and the column signal applied to the IC chip may be the 2-state signals of high and low, the row signal may be the scan signal, and the column signal may be the data signal. The row signal may include a plurality of pulse signals, and may scan the data signal during each pulse signal. The data signal included in the column signal may include the data reception signal and the data reception end signal with an image signal interposed therebetween, which will be described in detail below.

When a state of the column signal is converted from the high state to the low state (see (a) in FIG. 15) or vice versa (see (b) in FIG. 15) in response to the pulse included in the row signal, the IC chip may sense the data reception signal or the data reception end signal. Specifically, while the pulse signal included in the row signal is applied, the state of the column signal may be converted from the high state to the low state or vice versa.

In response to the pulse included in the row signal, the IC chip may sense one of the data reception signal and the data reception end signal when the state of the column signal is converted from the high state to the low state, and sense the other when the state of the column signal is converted from the low state to the high state. For example, (c) in FIG. 15 shows an embodiment in which, in response to the pulse included in the row signal, the IC chip senses the data reception signal when the state of the column signal is converted from the high state to the low state, and senses the data reception end signal when the state of the column signal is converted from the low state to the high state. In some cases, the IC chip may sense the data reception signal and the data reception end signal in a reverse manner.

However, because the column signal includes a start signal and an end signal between the image data signals, a problem of image data transmission delay between the interposers may occur, which will be described with reference to FIG. 16.

Figure 16:
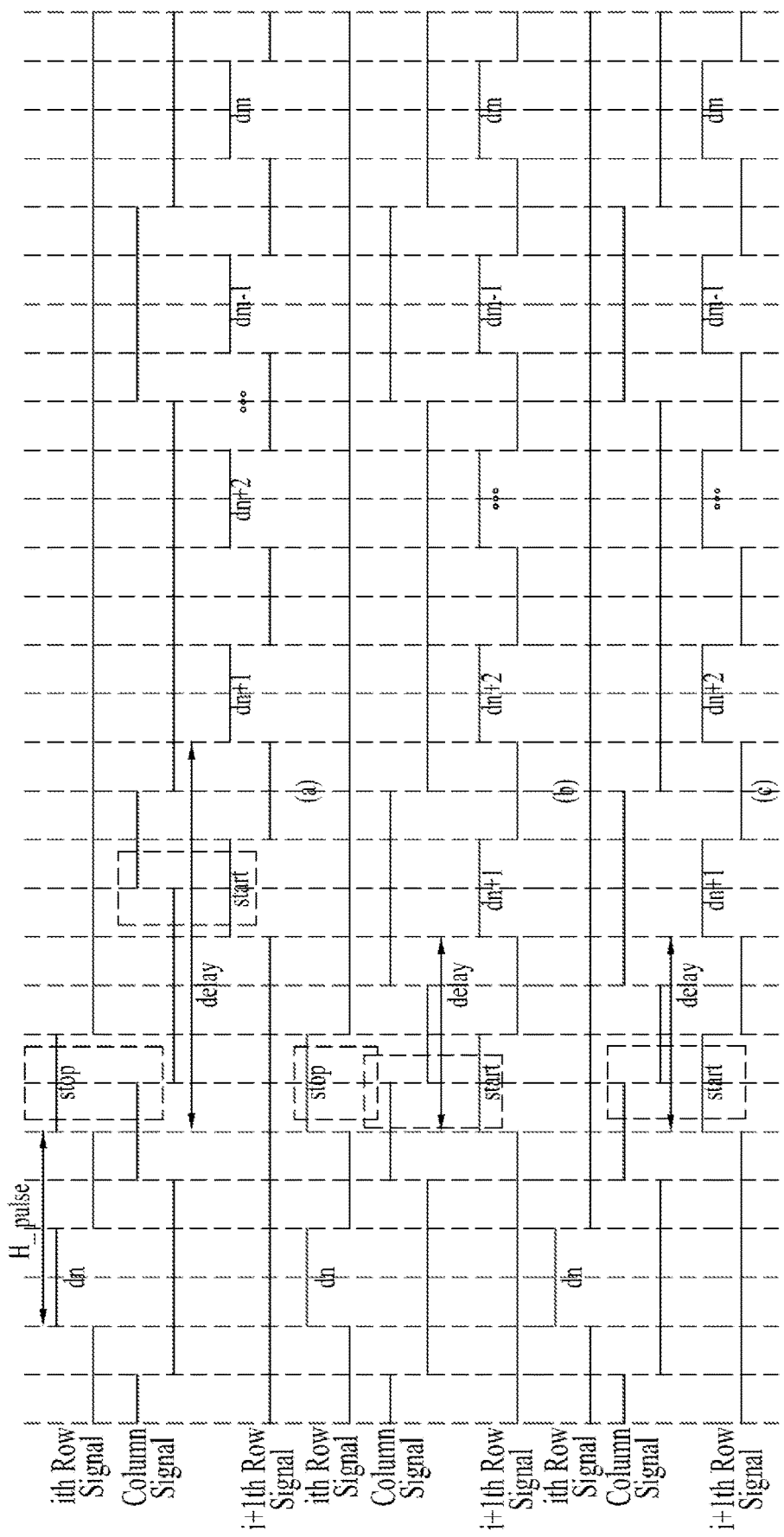
FIG. 16 shows an embodiment of a row signal and a scan signal applied to an interposer disposed in an i-th row and a row signal and a scan signal applied to an interposer disposed in an i+1-th row.

FIG. 16 shows an embodiment of a row signal and a scan signal applied to an interposer disposed in an i-th row and a row signal and a scan signal applied to an interposer disposed in an i+1-th row. A description of the same signal may refer to the description of FIG. 15.

The display device using the semiconductor light emitting element according to one embodiment may include the plurality of interposers 340 to implement a large screen. Specifically, the display device may include the plurality of interposers 340 along the row and column directions. In this case, the display device may sequentially provide the row signals to the plurality of row lines and simultaneously provide the column signals to the plurality of column lines.

When the interposer applies the data reception signal and the data reception end signal via the row signal and the column signal, a delay may occur between image data reception of an interposer 340 disposed in the i-th row and an interposer 340 disposed in the i+1-th row.

For example, referring to (a) in FIG. 15, when all image data are transmitted and the data reception end signal is applied to the interposer disposed in the i-th row, after the interposer disposed in the i+1-th row applies the data reception signal, data image signals may be sequentially applied. In this case, a delay by twice the pulse period (H_pulse) may occur in image transmission.

When the number of rows increases as the size of the display device increases, the image data transmission delay between the interposers may occupy a large portion of a frame time, which may cause a problem in screen continuity.

To solve such problem, the display device using the semiconductor light emitting element may sequentially provide the row signals along the plurality of row lines such that the row signals partially overlap each other for the data reception end signal of the i-th interposer and the data reception signal of the i+1-th interposer to proceed simultaneously.

For example, (b) in FIG. 15 shows an embodiment in which the row signal applied to the i-th interposer and the row signal sequentially applied to the i+1-th interposer overlap each other by one pulse period (H-pulse). The i-th interposer may sense the data reception end signal at a last pulse induced by the row signal, and at the same time, the i+1-th interposer may sense the data reception signal at a first pulse induced by the row signal. In this case, the image data delay time may be reduced from twice to one time the pulse period (H_pulse).

However, in the case of (b) in FIG. 15, the i-th interposer and the i+1-th interposer must sense the same signal transmitted via the column signal as the data reception end signal and the data reception signal, respectively. Therefore, when the data reception signal (hereinafter, referred to as an i-th data reception signal) and the data reception end signal (hereinafter, referred to as an i-th data reception end signal) applied to the interposer disposed in the i-th row are different from each other, the interposer disposed in the i+1-th row may sense the same signal as the i-th data reception end signal as the data reception signal, and sense the same signal as the i-th data reception end signal as the data reception end signal.

In some cases, the image data delay time may be reduced from twice to one time the pulse period (H_pulse) by replacing the data collection end signal applied to the interposer with the pulse count. In this case, because the row signals may be sequentially applied to the plurality of row lines without overlapping, there is an advantage in that a circuit configuration is simpler.

For example, (c) in FIG. 15 shows an embodiment in which the data reception end signal is omitted. Each interposer may sense the number of pulses of the row signal after the data reception signal and replace the data reception end signal with the number of pulses of the row signal.

Hereinafter, structural characteristics of the interposer will be described in more detail.

Figure 17:
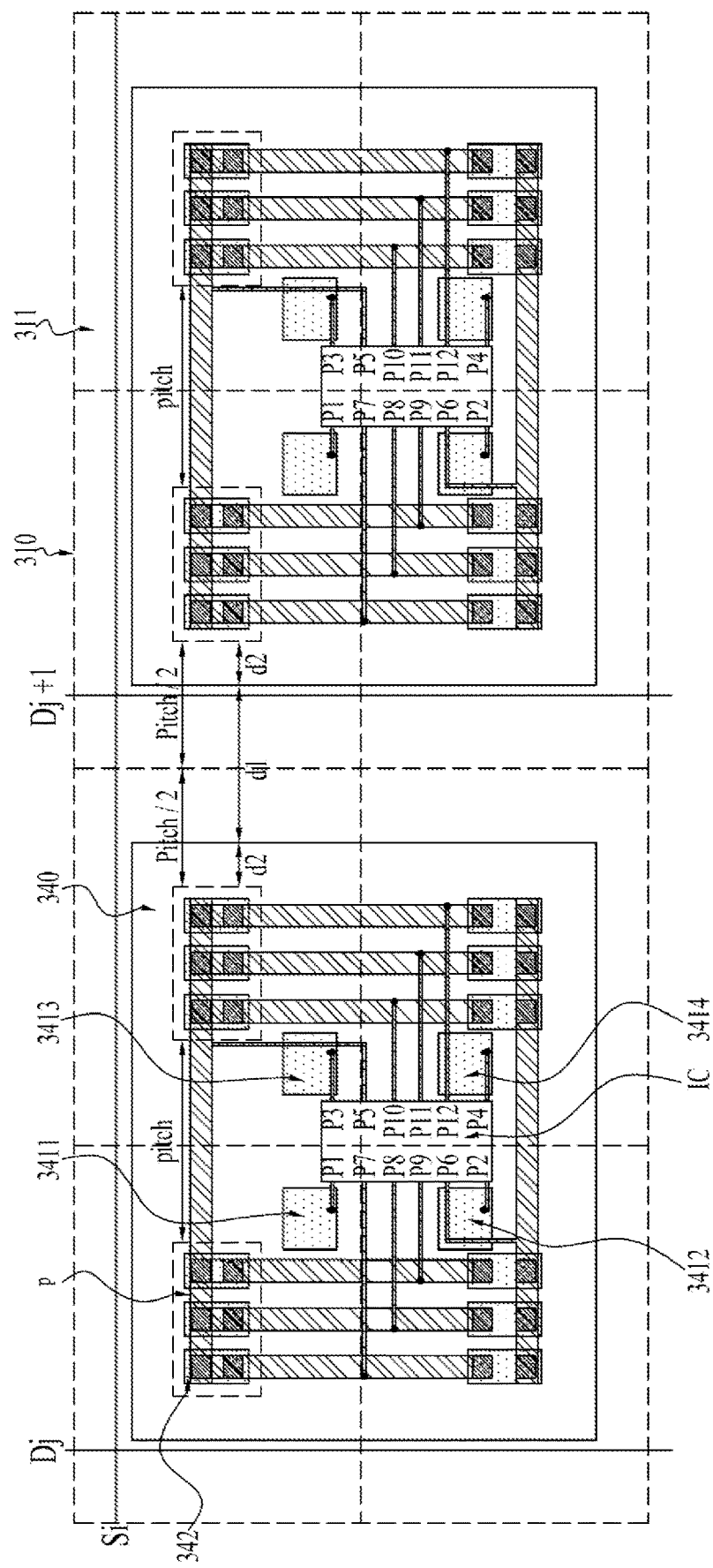
FIG. 17 is a partially enlarged view for illustrating a positional relationship between interposers disposed on a wiring substrate so as to be adjacent to each other.

FIG. 17 is a partially enlarged view for illustrating a positional relationship between interposers disposed on a wiring substrate so as to be adjacent to each other. A description of the same component may refer to the descriptions of FIGS. 12 and 13.

The display device 300 according to one embodiment may include the image output panel 310 and output the image on the image output panel 310.

The image output panel 310 may include a wiring substrate 311 including the row line Si for providing the row signal, the column line Dj for providing the column signal, the VCC line (not shown) connected to the VCC input terminal, and the VDD line (not shown) connected to the VDD input terminal. The multiple row lines Si and the multiple column lines Dj may be arranged in the matrix form, and the interposer 340 may be included at each intersection thereof.

The interposer 340 may include the multiple pixels P along the plurality of rows and the plurality of columns and may include the IC chip for controlling the light emission of the arranged pixels P.

One interposer 340 and an interposer 340 adjacent thereto may be disposed on the wiring substrate 311 such that the pixels P are positioned on the same arrangement. The pixels P in one interposer 340 may be arranged on the wiring substrate 311 such that a pitch therebetween is the same as a pitch between the pixels arranged in the adjacent interposer 340.

Arranging the interposers 340 to cover an entirety of the wiring substrate 311 may be detrimental to the flexibility of the display device. Accordingly, the interposer 340 may be arranged on the wiring substrate 311 so as to be spaced apart by a predetermined distance d1 from the adjacent interposer 340. To this end, the interposer 340 may be designed such that a distance d2 between an edge and a pixel P adjacent to the edge is smaller than half of the pitch distance between the pixels P.

Because only the wiring substrate 311 is disposed in an area between the interposers 340, the area between the interposers 340 may have a thickness smaller than that of an area with the interposer 340, and may not receive a fixing force by the interposer 340, which may be advantageous for the flexibility of the entire display device. In this regard, the fixing force may correspond to a degree of not bending.

In some cases, the area between the interposers 340 may be covered with a protective film. The protective film may have a thickness equal to or smaller than a thickness of the interposer 340. In addition, the protective film may have a smaller fixing force than the fixing force of the interposer 340. For example, the interposer 340 may be covered with another protective film, and the protective film for covering the interposer 340 may require some degree of rigidity because the interposer 340 includes the semiconductor light emitting element 340. In this regard, the protective film for covering the area between the interposers 340 may have smaller rigidity than the protective film for covering the interposer 340, so that the flexibility of the entire display device may be increased.

Figure 18:
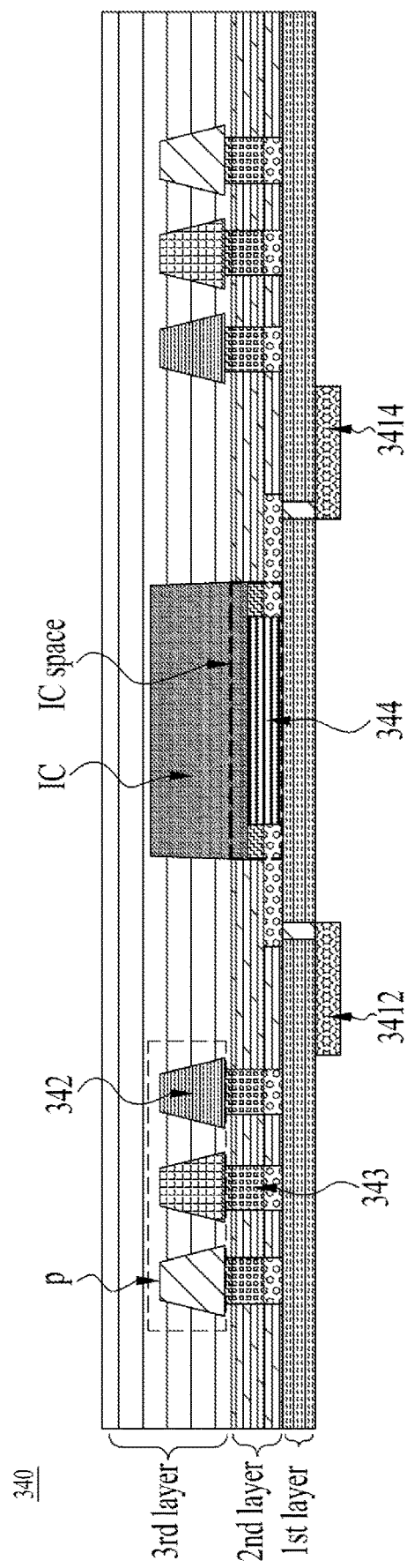
FIG. 18 is a cross-sectional view of an interposer taken along a line E-E' in FIG. 13.

FIG. 18 is a cross-sectional view of an interposer taken along a line E-E' in FIG. 13. A description of the same component below may refer to the descriptions of FIGS. 12 and 13.

The display device 300 according to one embodiment may include the image output panel 310 and output the image on the image output panel 310.

The image output panel 310 may include the wiring substrate 311 including the row line Si for providing the row signal, the column line Dj for providing the column signal, the VCC line (not shown) connected to the VCC input terminal, and the VDD line (not shown) connected to the VDD input terminal. The multiple row lines Si and the multiple column lines Dj may be arranged in the matrix form, and the interposer 340 may be included at each intersection thereof.

The interposer 340 may include the multiple pixels P along the plurality of rows and the plurality of columns and may include the IC chip for controlling the light emission of the arranged pixels P.

The IC chip may include a complex circuit configuration to control the plurality of pixels P, which may lead to an increase in the size of the IC chip. Considering that a size of the semiconductor light emitting element 342 becomes relatively smaller, the thickness of the IC chip may affect the thickness of the display device. Therefore, to prevent the thickness of the display device from increasing because of the thickness of the IC chip, the IC chip may be disposed on a layer disposed lower than the layer on which the semiconductor light emitting element 342 is disposed.

Specifically, the interposer 340 may include a first layer including the IC chip and including first to fourth terminals 3411 to 3414 connected to the IC chip on a rear surface thereof, a second layer deposited on the first layer avoiding an area where the IC chip is disposed and including the semiconductor light emitting element 342 on a top surface thereof, and a third layer deposited on the second layer and covering the IC chip and the semiconductor light emitting element 342.

The second layer may include the semiconductor light emitting element 342 on the top surface thereof and may include a hole or a groove (an IC space) into which the IC chip may be inserted to form a level difference d3 between a bottom surface of the semiconductor light emitting element 342 and a bottom surface of the IC chip. The bottom surface of the IC chip is positioned lower than the bottom surface of the semiconductor light emitting element 342 to prevent an overall thickness of the display device from increasing with the thickness of the IC chip.

A wiring circuit 343 for connecting the IC chip and the semiconductor light emitting element 342 to each other may be disposed on at least one of the second layer and the third layer. When the semiconductor light emitting element 342 is in the form of the flip-chip, the wiring circuit 343 may be disposed only on the second layer. When the semiconductor light emitting element 342 is of the horizontal or vertical type, the wiring circuit 343 may be additionally disposed on the third layer. However, it may be preferable that the wiring circuit 343 for connecting the IC chip and the semiconductor light emitting element 342 to each other is not disposed on the first layer. This is because an increase in a thickness of the first layer, which is a layer on which the IC chip is disposed on a top surface, cannot offset the thickness of the IC chip.

Figure 19:
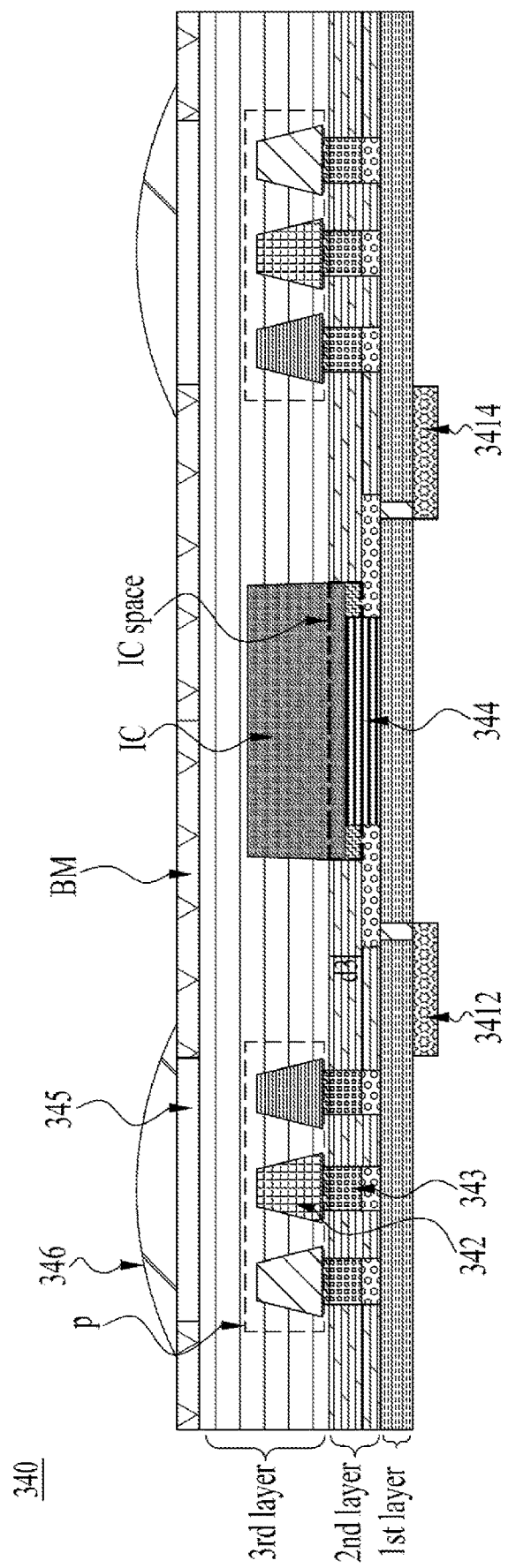
FIG. 19 is a cross-sectional view for illustrating another embodiment of an interposer.

FIG. 19 is a cross-sectional view for illustrating another embodiment of an interposer. A description of the same component may refer to the description of FIG. 18.

The display device 300 according to one embodiment may include the image output panel 310 and output the image on the image output panel 310.

The image output panel 310 may include the wiring substrate 311 including the row line Si for providing the row signal, the column line Dj for providing the column signal, the VCC line (not shown) connected to the VCC input terminal, and the VDD line (not shown) connected to the VDD input terminal. The multiple row lines Si and the multiple column lines Dj may be arranged in the matrix form, and the interposer 340 may be included at each intersection thereof.

The interposer 340 may include the multiple pixels P along the plurality of rows and the plurality of columns and may include the IC chip for controlling the light emission of the arranged pixels P.

The first to fourth terminals 3411 to 3414 included in the interposer 340 may be disposed in an area between the pixels P. The display device may be designed to emit the light from a front surface, from a rear surface, or from both surfaces.

When the first to fourth terminals 3411 to 3414 are overlapped with the semiconductor light emitting elements 342, the light emission may be obstructed.

At least one of the first to fourth terminals 3411 to 3414 may extend in the row direction or the column direction. The first to fourth terminals 3411 to 3414 may be disposed in the area between the pixels P, and may lack an area size in contact with the row line, the column line, the VCC line, and the VDD line arranged on the wiring substrate 311 (see FIG. 17). When the contact area size is not sufficient, there may be a signal loss. To prevent such a signal loss, at least one of the first to fourth terminals 3411 to 3414 may sufficiently extend in the row direction or the column direction in the area between the pixels P.

The first to fourth terminals 3411 to 3414 may be made of a metal material and may cause problems of reflecting external light and reducing a black contrast. To prevent such problems, the interposer 340 may include black molding BM for covering the first to fourth terminals 3411 to 3414. The black molding BM may cover the top surface of the interposer 340 avoiding the area of the pixels P. the black molding BM may cover the top surface of the interposer 340 to cover the IC chip.

The black molding BM may limit a light emission angle of the semiconductor light emitting element 342. For example, light emission in an oblique direction may be restricted without restricting forward light emission of the semiconductor light emitting element 342. In this case, the image may not be sufficiently delivered to an observer looking at the display device in the oblique direction. To solve such problem, at least one of a spatial area 345 and a lens 346 for distributing light may be included on the area of the pixels P.

The spatial area 345 or the lens 346 may be disposed between black moldings BM. In some cases, the spatial area 345 may be disposed between the black moldings BM, and the lens 346 may be disposed in the spatial area 345 such that an end thereof overlaps the black molding BM.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

What is claimed is:

1. A display device using semiconductor light emitting elements, the display device comprising:
   a wiring substrate including a row line for providing a row signal, a column line for providing a column signal, a VCC line connected to a VCC input terminal, and a VDD line connected to a VDD input terminal; and
   an interposer disposed on the wiring substrate, having pixels including the semiconductor light emitting elements disposed along a plurality of rows and a plurality of columns, and an IC chip for controlling light emission of the pixels,
   wherein the interposer includes:
   a first terminal connected to the row line and transmitting the row signal to the IC chip;
   a second terminal connected to the column line and transmitting the column signal to the IC chip;
   a third terminal connected to the VCC line so as to connect the VCC input terminal and the IC chip; and
   a fourth terminal connected to the VDD line so as to connect the VDD input terminal and the IC chip.

2. The display device of claim 1, wherein the row signal is a 2-state signal of high and low for turning on/off a transistor disposed on the IC chip,
   wherein the column signal is a 2-state signal of high and low for driving the semiconductor light emitting elements in a state in which the transistor is turned on.

3. The display device of claim 2, wherein the IC chip is configured to:
   sense at least one of a data reception signal or a data reception end signal using the high and low states of the row signal and the column signal; and
   provide the row signal and the column signal applied between the data reception signal and the data reception end signal to a driving circuit for driving the pixel.

4. The display device of claim 3, wherein the IC chip is configured to:
   count pulses included in the row signal after sensing the data reception signal; and
   sequentially provide the row signal and the column signal to a driving circuit of a corresponding pixel corresponding to the count.

5. The display device of claim 4, wherein, in response to the pulses included in the row signal, the IC chip senses the data reception signal and the data reception end signal based on the column signal being switched from the high state to the low state or vice versa.

6. The display device of claim 4, wherein, in response to the pulses included in the row signal, the IC chip senses one of the data reception signal or the data reception end signal based on the column signal being switched from the high state to the low state and senses the other based on the column signal being switched from the low state to the high state.

7. The display device of claim 3, wherein the interposer further includes a plurality of interposers arranged along the plurality of rows and the plurality of columns,
   wherein the row signals are provided to the interposers along the plurality of rows,
   wherein the row signals partially overlap such that an n-th data reception end signal is applied to an interposer disposed in an n-th row, and simultaneously, an n+1-th data reception signal is applied to an interposer disposed in an n+1-th row.

8. The display device of claim 7, wherein, based on an n-th data reception signal and the n-th data reception end signal applied to the interposer disposed in the n-th row being different from each other, the interposer disposed in the n+1 row senses an identical signal as the n-th data reception end signal as the n+1-th data reception signal and senses an identical signal as the n-th data reception signal as an n+1-th data reception end signal.

9. The display device of claim 1, wherein a distance between an edge and a pixel adjacent to the edge is smaller than a half of a pitch distance between the pixels in the interposer.

10. The display device of claim 9, wherein the interposer is covered with a first protective film,
    wherein the interposer further includes a plurality of interposers, and an area between the interposers is covered with a second protective film having a smaller rigidity than the first protective film.

11. The display device of claim 1, wherein the interposer further includes:
  a first layer including the IC chip on a top surface thereof and including the first to fourth terminals connected to the IC chip on a rear surface thereof;
  a second layer deposited on the first layer avoiding an area where the IC chip is disposed and including the semiconductor light emitting elements on a top surface thereof; and
  a third layer deposited on the second layer and covering the IC chip and the semiconductor light emitting elements.

12. The display device of claim 11, wherein at least one of the second layer or the third layer includes a wiring circuit for connecting the IC chip and the semiconductor light emitting elements.

13. The display device of claim 1, wherein the interposer has the first to fourth terminals in an area between the pixels.

14. The display device of claim 1, wherein the interposer further includes black molding for covering the first to fourth terminals.

15. The display device of claim 1, wherein the IC chip drives the semiconductor light emitting elements in an active matrix (AM) manner.

16. A display device using semiconductor light emitting elements, the display device comprising:
  a wiring substrate including a row line for providing a row signal, a column line for providing a column signal, a VCC input terminal, and a VDD input terminal; and
  an interposer disposed on the wiring substrate, having pixels including the semiconductor light emitting elements disposed along a plurality of rows and a plurality of columns, and an IC chip for controlling light emission of the pixels,
  wherein the interposer includes:
    a first terminal connected to the row line and transmitting the row signal to the IC chip; and
    a second terminal connected to the column line and transmitting the column signal to the IC chip.

17. The display device of claim 16, further comprising:
  a third terminal for connecting the VCC input terminal and the IC chip; and
  a fourth terminal for connecting the VDD input terminal and the IC chip.

18. The display device of claim 17, wherein the interposer further includes:
  a first layer including the IC chip on a top surface thereof and including the first to fourth terminals connected to the IC chip on a rear surface thereof;
  a second layer deposited on the first layer avoiding an area where the IC chip is disposed and including the semiconductor light emitting elements on a top surface thereof; and
  a third layer deposited on the second layer and covering the IC chip and the semiconductor light emitting elements.

19. The display device of claim 18, wherein at least one of the second layer or the third layer includes a wiring circuit for connecting the IC chip and the semiconductor light emitting elements.

20. The display device of claim 17, wherein at least one of the second layer or the third layer includes a wiring circuit for connecting the IC chip and the semiconductor light emitting elements.

* * * * *